US008848142B2

(12) United States Patent
Park et al.

(10) Patent No.: US 8,848,142 B2
(45) Date of Patent: Sep. 30, 2014

(54) LIQUID CRYSTAL DISPLAY DEVICE INCLUDING BLACK MATRIX AND METHOD OF FABRICATING THE SAME

(75) Inventors: Yong-In Park, Anyang-si (KR); Dai-Yun Lee, Uiwang-si (KR); Young-Joo Kim, Anyang-si (KR); Su-Hyuk Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 193 days.

(21) Appl. No.: 11/454,505

(22) Filed: Jun. 16, 2006

(65) Prior Publication Data

US 2007/0064179 A1 Mar. 22, 2007

(30) Foreign Application Priority Data

Sep. 20, 2005 (KR) ........................ 10-2005-0087265

(51) Int. Cl.
| G02F 1/1333 | (2006.01) |
|---|---|
| G02F 1/1343 | (2006.01) |
| G02F 1/136 | (2006.01) |
| G02F 1/1362 | (2006.01) |
| H01L 27/12 | (2006.01) |
| H01L 29/786 | (2006.01) |
| G02F 1/1345 | (2006.01) |

(52) U.S. Cl.
CPC ....... *G02F 1/136209* (2013.01); *H01L 27/1214* (2013.01); *G02F 2201/40* (2013.01); *H01L 29/78633* (2013.01); *G02F 1/13454* (2013.01)
USPC .............. 349/110; 349/38; 349/43; 349/44; 349/143

(58) Field of Classification Search
CPC ................... G02F 1/136209; G02F 1/136213
USPC ................ 349/38, 39, 42–44, 110, 139, 143
See application file for complete search history.

(56) References Cited

U.S. PATENT DOCUMENTS

| 5,696,568 | A | 12/1997 | Yamamoto et al. |
|---|---|---|---|
| 6,175,395 | B1 * | 1/2001 | Yamazaki et al. ............ 349/44 |
| 6,900,856 | B2 * | 5/2005 | Kim et al. ...................... 349/44 |
| 2003/0153110 | A1 | 8/2003 | Hotta et al. |
| 2003/0169380 | A1 * | 9/2003 | Arao ............................... 349/43 |
| 2004/0109098 | A1 * | 6/2004 | Kim et al. ...................... 349/38 |
| 2004/0179157 | A1 * | 9/2004 | Kim et al. .................... 349/114 |

FOREIGN PATENT DOCUMENTS

| JP | 07-128685 | 5/1995 |
|---|---|---|
| JP | 09-105953 | 4/1997 |
| JP | 2000-275676 | 10/2000 |
| JP | 2005-196157 | 7/2005 |

OTHER PUBLICATIONS

First Office Action for corresponding Chinese Patent Application Serial No. 2006100871741, dated Nov. 30, 2007.
Office Action issued in corresponding Chinese Patent Application No. 200610087174; issued Sep. 19, 2008.
Office Action issued in corresponding Japanese Patent Application No. 2006-173517; mailed Aug. 19, 2009.

* cited by examiner

*Primary Examiner* — Bumsuk Won
*Assistant Examiner* — Paisley L Arendt
(74) *Attorney, Agent, or Firm* — Brinks Gilson & Lione

(57) ABSTRACT

A liquid crystal display (LCD) device and a method fabricating the same are provided. The LCD device and the method of fabricating the same have the shielding means formed directly on the array substrate instead of the color filter substrate of the opposite substrate to the array substrate.

5 Claims, 16 Drawing Sheets

LIQUID CRYSTAL DISPLAY DEVICE INCLUDING BLACK MATRIX AND METHOD OF FABRICATING THE SAME

This application claims the benefit of Korean Patent Application No. 2005-0087265, filed on Sep. 20, 2005, which is hereby incorporated by reference for all purposes as if set forth herein.

BACKGROUND

1. Field

A liquid crystal display (LCD) device and a method fabricating the same is provided.

2. Related Art

Flat panel display (FPD) devices that have high portability and low power consumption have been the subject of recent research and development. Among various types of FPD devices, liquid crystal display (LCD) devices are commonly used as monitors for notebook and desktop computers because of their ability to display high-resolution images, wide ranges of different colors, and moving images.

Generally, the LCD device includes a color filter substrate and an array substrate separated from each other by a liquid crystal layer interposed between the two substrates. The color filter substrate and the array substrate include a common electrode and a pixel electrode, respectively. When a voltage is supplied to the common electrode and the pixel electrode, an electric field is generated that changes the orientation of liquid crystal molecules of the liquid crystal layer due to optical anisotropy within the liquid crystal layer. Light transmittance characteristics of the liquid crystal layer are modulated and images are displayed by the LCD device.

Active matrix type display devices are commonly used because of their superiority in displaying moving images. Active matrix-type display devices include pixel regions disposed in a matrix form where a thin film transistor (TFT) is formed in the pixel region as a switching element. While forming the TFT, hydrogenated amorphous silicon (a-Si:H) is selected to be deposited over a large area of substrate. Hydrogenated amorphous silicon yields higher productivity while easily fabricated on the large area of the substrate. The hydrogenated amorphous silicon (a-Si:H) is deposited at a relatively low temperature, in which a glass substrate of low cost can be used. The hydrogenated amorphous silicon is used mainly in the TFT, which is referred to as an amorphous silicon thin film transistor (a-Si TFT).

Because the hydrogenated amorphous silicon has a disordered atomic arrangement, weak silicon-silicon (Si—Si) bonds and dangling bonds exist in the hydrogenated amorphous silicon. These types of bonds become metastable when light or an electric field is applied to the hydrogenated amorphous silicon. This metastability makes the TFT unstable. Electrical characteristics of the hydrogenated amorphous silicon are especially degraded due to light irradiation. A TFT that uses the hydrogenated amorphous silicon is difficult to implement in a driving circuit due to degraded electric characteristics such as a relatively low field effect mobility and a poor reliability.

To solve these problems, a polycrystalline silicon thin film transistor (p-Si TFT) is suggested. Due to the higher field effect mobility of a p-Si TFT compared to a a-Si TFT, fabrication of a driving circuit and a switching element can be achieved simultaneously. The production cost is reduced and a driving circuit is simply fabricated on a substrate where a switching element is formed.

FIG. 1 is a schematic view that shows an LCD device according to the related art where a switching element and a driving circuit are formed on a single substrate. In FIG. 1, a display area D1 and a non-display area D2 in a periphery of the display area D1 are defined on a single substrate 10. The display area D1 is disposed at a central portion of the substrate 10, while the non-display area D2 is disposed at left and top portions of the display area D1. The non-display area D2 includes a gate driving circuit 16 and a data driving circuit 18. The display area D1 includes a plurality of gate lines 12 connected to the gate driving circuit 16 and a plurality of data lines 14 connected to the data driving circuit 18. The gate line 12 and the data line 14 intersect each other to define a pixel region P. A pixel electrode 17 is formed in the pixel region P. A thin film transistor (TFT) Ts formed as a switching element is connected to the pixel electrode 17. The gate driving circuit 16 supplies a scan signal to the TFT Ts through the gate line 12 and the data driving circuit 18 supplies a data signal to the pixel electrode 17 through the data line 14.

The gate driving circuit 16 and the data driving circuit 18 are connected to an input terminal (not shown) to receive external signals (not shown). The gate driving circuit 16 and the data driving circuit 18 process the external signals from the input terminal to generate the scan signal and the data signal. To generate the scan signal and the data signal, the gate driving circuit 16 and the data driving circuit 18 include a plurality of TFTs that form complementary metal-oxide-semiconductor (CMOS) elements. For example, an inverter that includes negative (n)-type and positive (p)-type TFTs may be formed in the gate driving circuit 16 and the data driving circuit 18.

FIG. 2 is a schematic plane view that shows a display area of an LCD device according to the related art.

In FIG. 2, a gate line GL and a data line DL cross each other to define a pixel region P. A thin film transistor Ts is connected to the gate line GL and the data line DL. A pixel electrode 80, which is disposed in the pixel region P, is connected to the thin film transistor Ts. A storage capacitor Cst is disposed to be adjacent to the thin film transistor Ts in the pixel region P Typically, the pixel electrode 80 is spaced apart from the gate and the data lines GL and DL with a predetermined distance. When the pixel electrode 80 is overlapped with the gate line GL and the data line DL, cross-talk that deteriorates an image quality occurs. The pixel electrode 80 is formed to be spaced from the gate and the data lines GL and DL. Shield spaces SP are between the gate line GL and the pixel electrode 80 and between the data line DL and the pixel electrode 80. A black matrix 52 should be formed to overlap with the space SP. The black matrix 52 is formed to overlap with regions of the thin film transistor Ts and the storage capacitor Cst as well as the space SP.

FIG. 3 is a schematic cross-sectional view showing a driving circuit of an LCD according to the related art where a switching element and a driving circuit are formed on a single substrate. FIG. 4 is a schematic cross-sectional view taken along a line IV-IV of FIG. 2.

As shown in FIGS. 3 and 4, an LCD device includes a display area D1 and a non-display area D2. The display area D1 includes a pixel region P that includes a thin film transistor region TsA and a storage capacitor region CstA.

The LCD includes a first substrate 30, a second substrate 50 that faces the first substrate 30 and a liquid crystal layer 40 between the first and the second substrate 30 and 50 in the display area D1. A black matrix 52, which is disposed in the display area D1 and the non-display area D2, is disposed on an inner surface of the second substrate 50 and a color filter layer 54, which is disposed in the display area D1, on the black matrix 52, and a common electrode 56, which is disposed in the display area D1, is formed on the color filter layer 54. Although not shown, the color filter layer 54 includes red, green and blue sub-color filter layers (not shown) that are repeatedly arranged in that order. The black matrix 52 is overlapped with regions of the gate line GL, the data line DL and spaces SP between the gate line GL and the pixel electrode 80 and between the data line DL and the pixel electrode 80.

An align margin α should be considered before attaching the first and the second substrates 30 and 50 because light leakage may occur even if the black matrix 52 is formed in the mentioned regions due to an align error. Therefore, an image quality of the LCD device is deteriorated due to light leakage.

The black matrix 52 according to the related art should be manufactured with at least 5 micrometers (μm) as the align margin α. Therefore, although the light leakage is solved from the LCD, an aperture ratio is deteriorated concerning the align margin.

SUMMARY

An LCD device and a method of fabricating the same is provided.

A method that fabricates an array substrate for a liquid crystal display device includes: forming first to third semiconductor layers on a substrate that includes a display area and a non-display area, the first to second semiconductor layers in the non-display area and the third semiconductor layer in the display area; sequentially forming a gate insulating layer and first to third gate electrodes, the gate insulating layer on the substrate that includes the first to third semiconductor layers, the first to third gate electrodes correspond to central portions of the first to third semiconductor layers, respectively; forming an interlayer insulating layer on the substrate that includes the first to third gate electrodes, the interlayer insulating layer that has first to third contact holes that expose ohmic contact regions of the first to third semiconductor layers, respectively; forming first to third source and first to third drain electrodes and a data line on the interlayer insulating layer, the data line connected to the third source electrode and that crosses the gate line to define a pixel region, each of the first to third source and the first to third drain electrodes contact each of the first to third ohmic contact regions via each of the first to third contact holes; forming a passivation layer on the substrate that includes the first to third source and the first to third drain electrodes, the passivation layer having a drain contact hole that exposes a portion of the third drain electrode; forming a pixel electrode on the passivation layer, the pixel electrode connected to the third drain electrode via the drain contact hole; and forming a black matrix on the substrate including the pixel electrode, the black matrix in the non-display region and a non-pixel region of the display area.

In another embodiment, a method of fabricating an array substrate for a liquid crystal display device includes: preparing a substrate including a display area and a non-display area; forming a buffer layer on the substrate; depositing and crystallizing an amorphous silicon material and patterning the crystallized silicon material to form first and second semiconductor layers in the non-display area, a third semiconductor layer and a first storage electrode in the display region through a first mask process; forming a first photoresist pattern that covers the first to third semiconductor layers except the first storage electrode through a second mask process; doping the first storage electrode with high concentration n-type (n+) impurities; depositing a gate insulating layer and a first conductive metallic material, patterning the first conductive metallic material to form first to third gate electrodes on central portions of the first to third semiconductor layers, a second storage electrode on the first storage electrode and a gate line connected to the third gate electrode through a third mask process; forming a second PR pattern that covers the first gate electrode, the second PR pattern corresponds to a region in which the first semiconductor layer is formed through a fourth mask process; doping the second and third semiconductor layers with high concentration n-type (n+) impurities; forming a third PR pattern that covers the second gate electrode and a fourth PR pattern that covers the third gate electrode and the second storage electrode through a fifth mask process; doping the first semiconductor layer exposed from the second and the third PR patterns with high concentration p-type (p+) impurities; forming an interlayer insulating layer on the doped second and third semiconductor layers and patterning the interlayer insulating layer and the gate insulating layer to form first to third contact holes that expose ohmic contact regions of the first to third semiconductor layers, through a sixth mask process; depositing and patterning a second conductive metallic material on the substrate where the interlayer insulating layer that has the first to third contact holes formed thereon to form first source and drain electrodes, second source and second drain electrodes, third source and third drain electrodes and a data line connected to the third source electrode, the data line crossing the gate line to define a pixel region, the first source and the first drain electrodes, the second source and the second drain electrodes, the third source and the third drain electrodes contacting the first to third ohmic contact regions via the first to third contact holes, respectively, through a seventh mask process; forming a passivation layer on the substrate where the first to third source and the first to third drain electrodes, the passivation layer patterned to have a drain contact hole that exposes a portion of the third drain electrode through an eighth mask process; depositing and patterning a transparent conductive material to form a pixel electrode connected to the third drain electrode via the drain contact hole through a ninth mask process; and coating and patterning a black resin on the substrate including the pixel electrode to form a black matrix through a tenth mask process, the black matrix in the non-display region and a non-pixel region of the display region.

In another embodiment an array substrate for a liquid crystal display device comprises a p-type driving TFT, an n-type driving TFT and a switching TFT on a substrate that includes a display area and a non-display area, wherein the p-type and the n-type driving TFTs are the non-display area region and the switching TFT is in the display region; a gate insulating layer on the p-type and the n-type driving TFTs and the switching TFT; first, second and third gate electrodes and a gate line connected to the third gate electrode on the gate insulating layer, wherein the first, second and third gate electrodes correspond to central portions of the first, second and third semiconductor layers; an interlayer insulating layer on the substrate that includes the first, second and third gate electrodes, wherein the interlayer insulating layer has first, second and third contact holes that expose portions of ohmic contact regions of the p-type and the n-type driving TFTs and the switching TFT; first, second and third source electrodes and first, second and third drain electrodes and a data line on the interlayer insulating layer, wherein the data line is connected to the third source electrode and crosses the gate line to define a pixel region, wherein each of the first, second and third source electrodes and the first, second and third drain electrodes contacts each of the first, second and third ohmic contact regions via each of the first to third contact holes; a passivation layer on the substrate that includes the first, second and third source electrodes and the first, second and third drain electrodes, wherein the passivation layer has a drain contact hole that exposes a portion of the third drain electrode; a pixel electrode on the passivation layer, wherein the pixel electrode connects to the third drain electrode via the drain contact hole; and a black matrix on the substrate that includes the pixel electrode, wherein the black matrix is in the non-display region and a non-pixel region of the display area.

It is to be understood that both the foregoing general description and the following detailed description are exemplary and explanatory and are intended to provide further explanation of the embodiments as claimed.

DRAWINGS

The accompanying drawings, which are included to provide a further understanding of the embodiments and are incorporated in and constitute a part of this specification, serve to explain the principles of the embodiments.

DESCRIPTION

Figure 1:
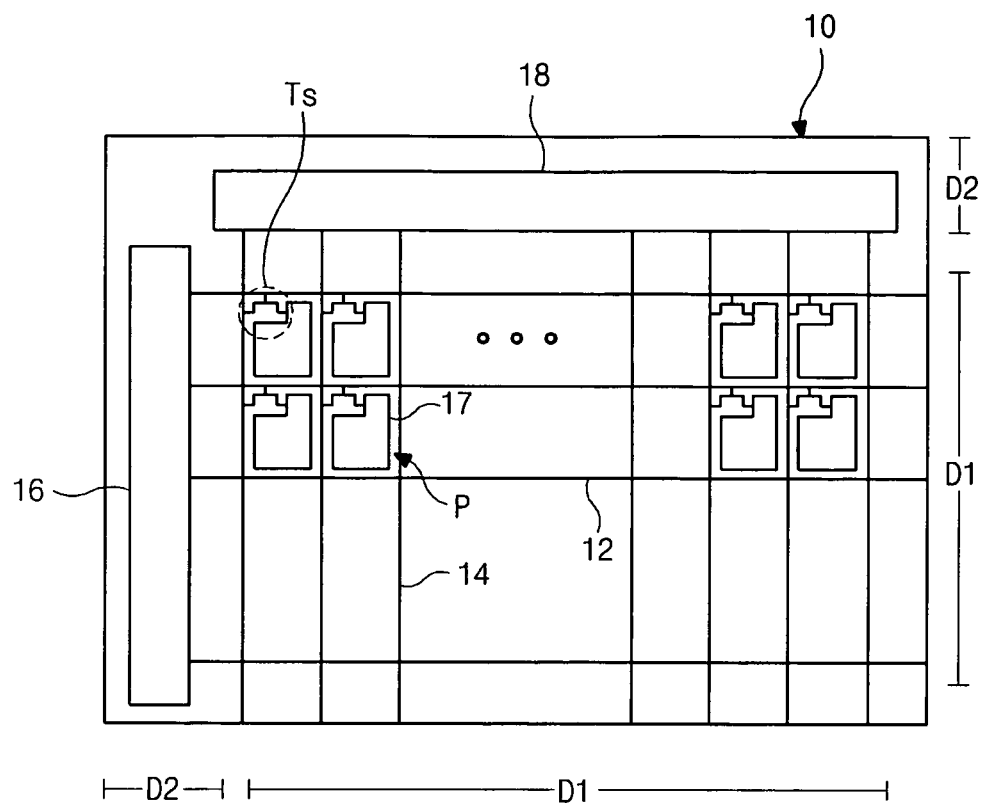
FIG. 1 is a schematic view that shows an LCD device according to the related art where a switching element and a driving circuit are formed on a single substrate.
Figure 2:
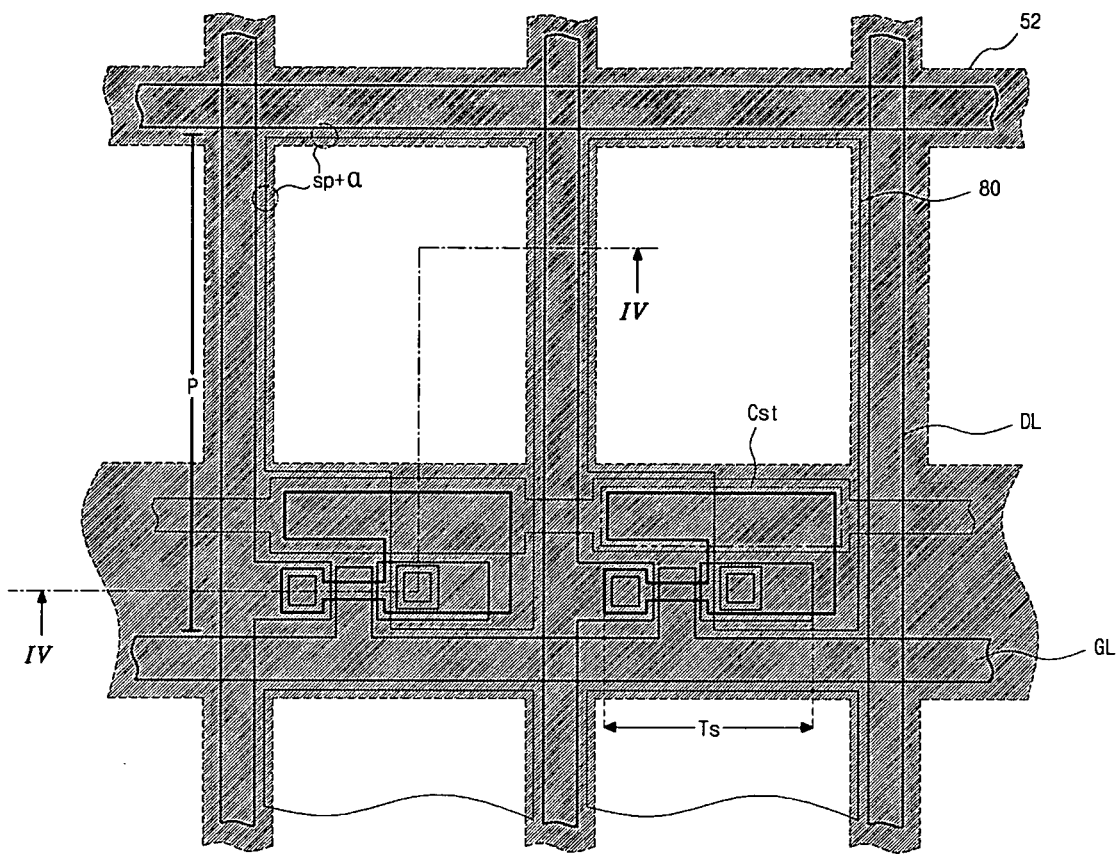
FIG. 2 is a schematic plane view that shows a display area of an LCD device according to the related art.
Figure 3:
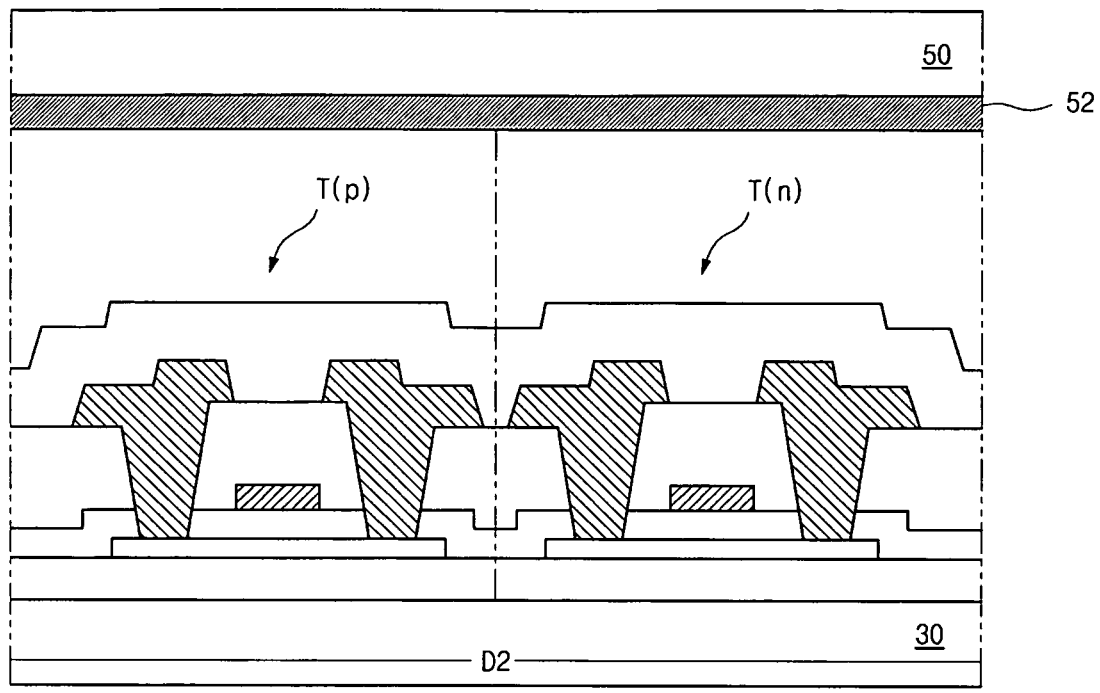
FIG. 3 is a schematic cross-sectional view that shows a driving circuit of an LCD according to the related art where a switching element and a driving circuit are formed on a single substrate.
Figure 4:
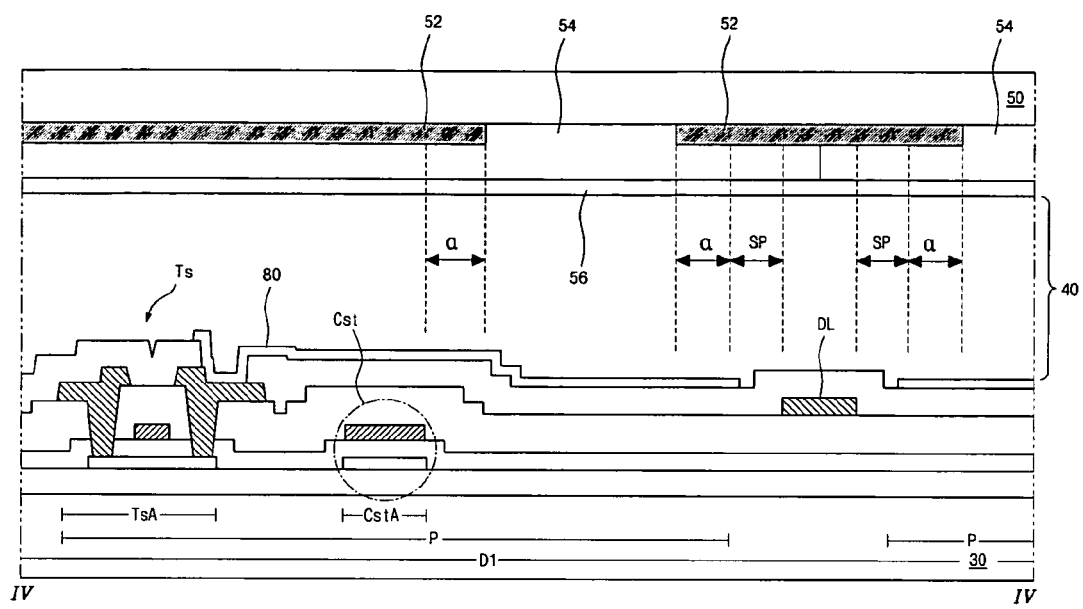
FIG. 4 is a schematic cross-sectional view taken along a line IV-IV of FIG. 2.
Figure 5:
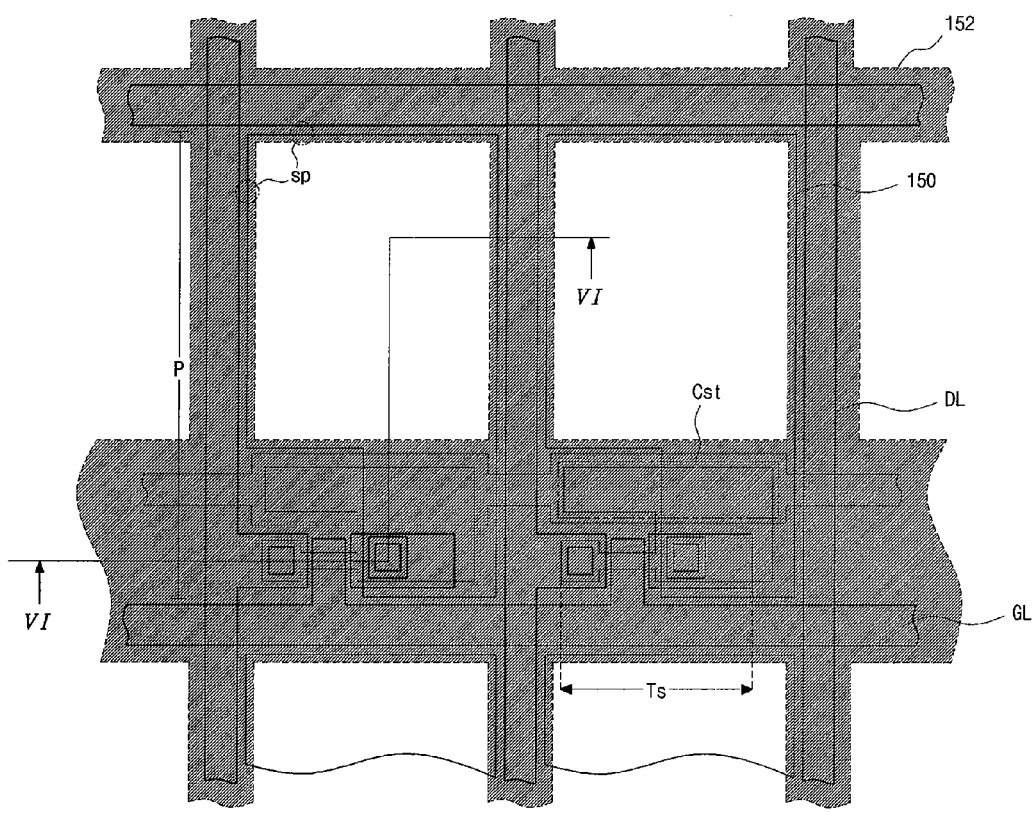
FIG. 5 is a schematic plane view that shows a display area of an LCD device.
Figure 6A:
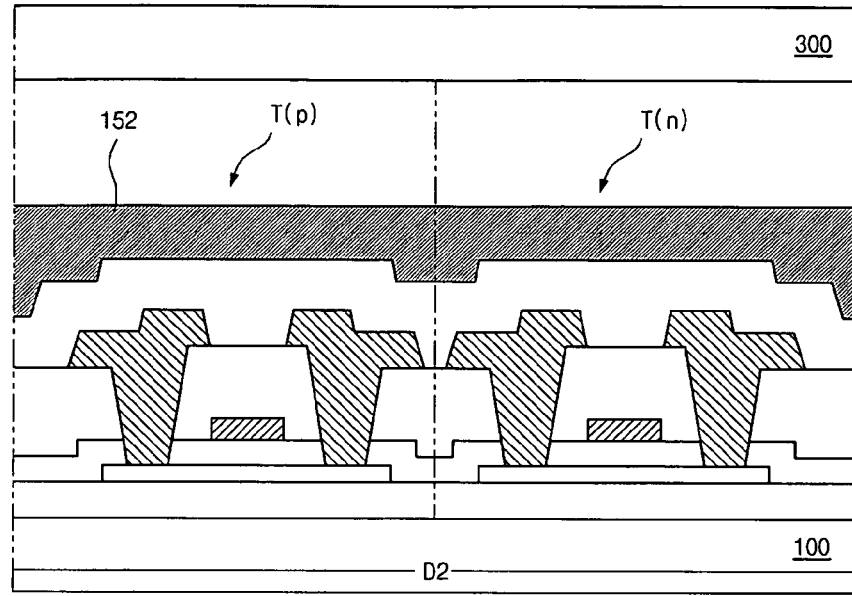
FIG. 6A is a schematic cross-sectional view that shows a driving circuit of an LCD where a switching element and a driving circuit are formed on a single substrate.
Figure 6B:
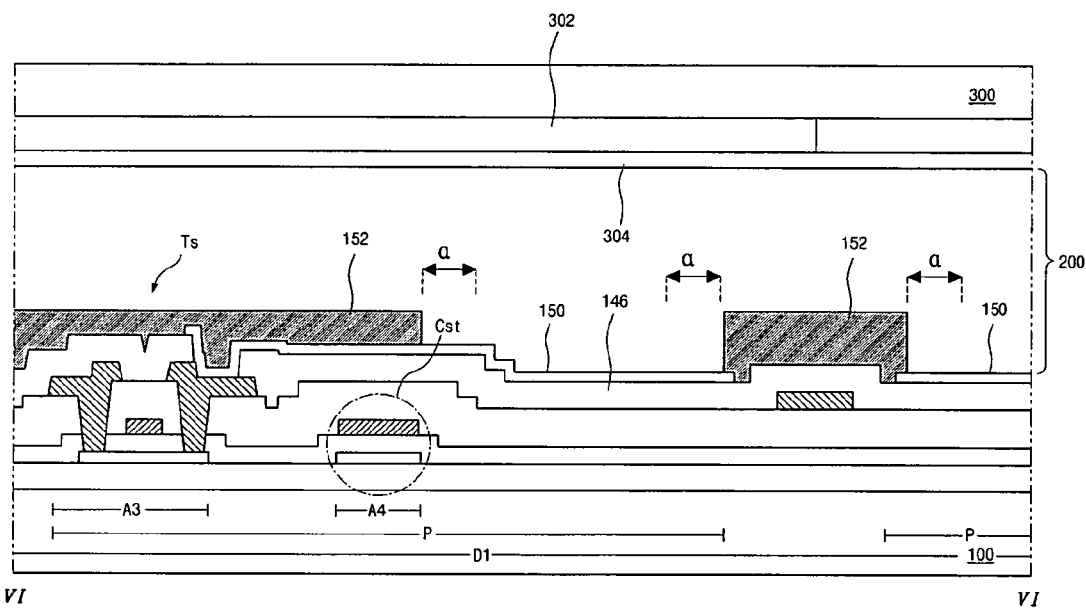
FIG. 6B is a schematic cross-sectional view taken along a line VI-VI of FIG. 5.

A LCD device includes a first substrate 100, as shown in FIGS. 5, 6A and 6B. A second substrate 300 faces the first substrate 100 and a liquid crystal layer 200 is disposed between the first and the second substrates 100 and 300 in the display area D1. The first and the second substrates 100 and 300 include a display area D1 and a non-display area D2. A p-type thin film transistor T(p) and an n-type thin film transistor T(n) are formed on an inner surface of the first substrate 100 disposed in the non-display area D2 and are used as a driving circuit. A gate line GL, a data line DL, a switching thin film transistor Ts, a storage capacitor Cst and a pixel electrode 150 are formed on the inner surface of the first substrate 100 in the display area D1. A passivation layer 146 is formed on a surface of the first substrate 100 where the gate line GL, the data line DL, the switching thin film transistor Ts, the storage capacitor Cst are formed.

A black matrix 152 is formed on the passivation layer 146 over the gate line GL, the data line DL, the switching thin film transistor Ts, the storage capacitor Cst and spaces SP between the gate line GL and the pixel electrode 150 and between the data line DL and the pixel electrode 150 in the display area D1 and in the non-display area D2. For example, the black matrix 152 includes a black resin.

A color filter layer 302 is formed on an inner surface of the second substrate 300 and a common electrode 304 is formed on the color filter layer 302. The color filter layer 302 may be formed on the first substrate 100 instead of the second substrate 300.

It is unnecessary to consider the align margin α, because the black matrix 152 is formed on the first substrate 100. An aperture region that corresponds to the align margin α can be formed because the black matrix 152 is formed on the first substrate 100.

FIGS. 7A to 7J and FIGS. 8A to 8J are schematic cross-sectional views that show a fabricating process of an LCD device.

Figure 7A:
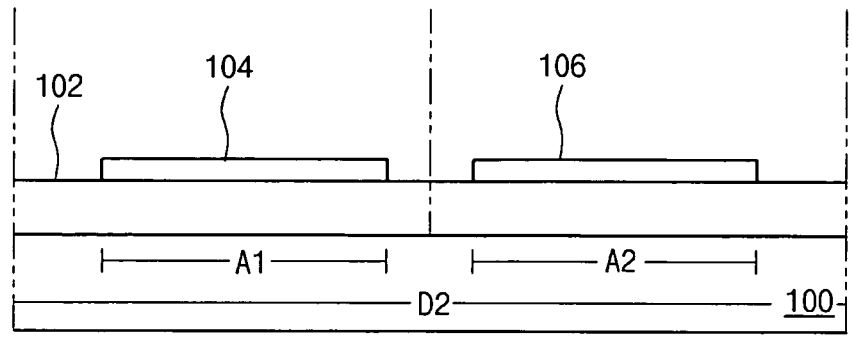
FIGS. 7A to 7J and FIGS. 8A to 8J are schematic cross-sectional views that shows a fabricating process of an LCD device.
Figure 8A:
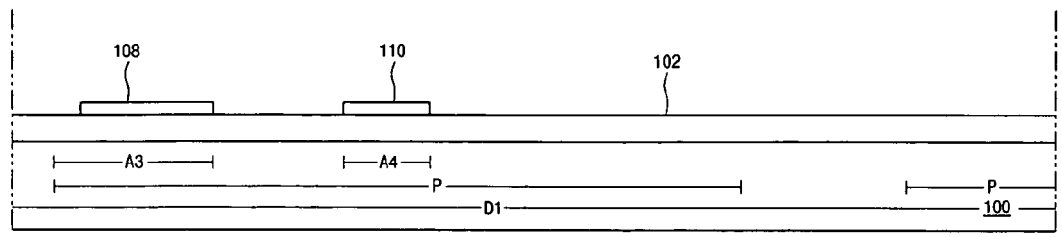

As shown in FIGS. 7A and 8A, a first substrate 100 includes a display area D1 and a non-display area D2. The non-display area D2 includes first and second regions A1 and A2, and the display area D1 includes a pixel region P that has third and fourth regions A3 and A4.

A buffer layer 102 is formed on the first substrate 100 in the display area D1 and the non-display area D2. First and second semiconductor layers 104 and 106 in the non-display area D2, a third semiconductor layer 108 and a first storage electrode 110 in the display region D1 are formed by depositing and crystallizing an amorphous silicon material and patterning the crystallized silicon material through a first mask process.

Figure 7B:
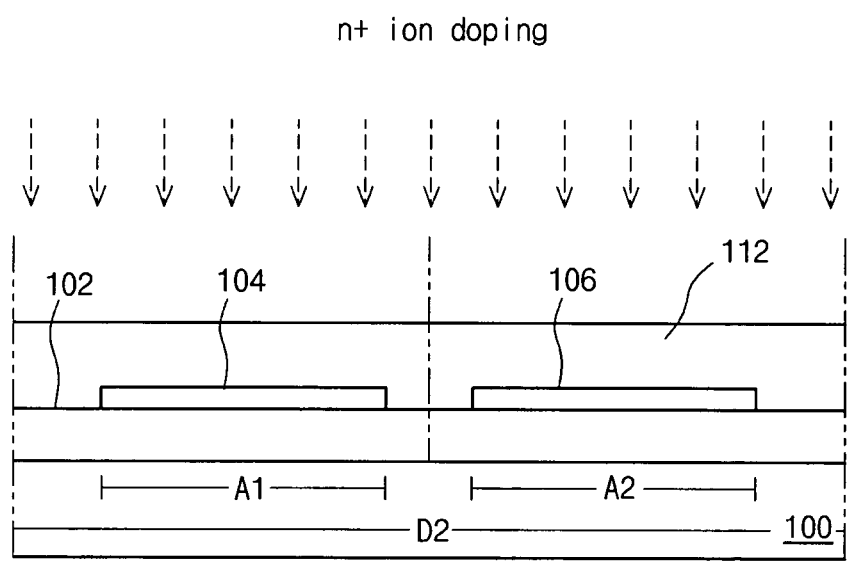
Figure 8B:
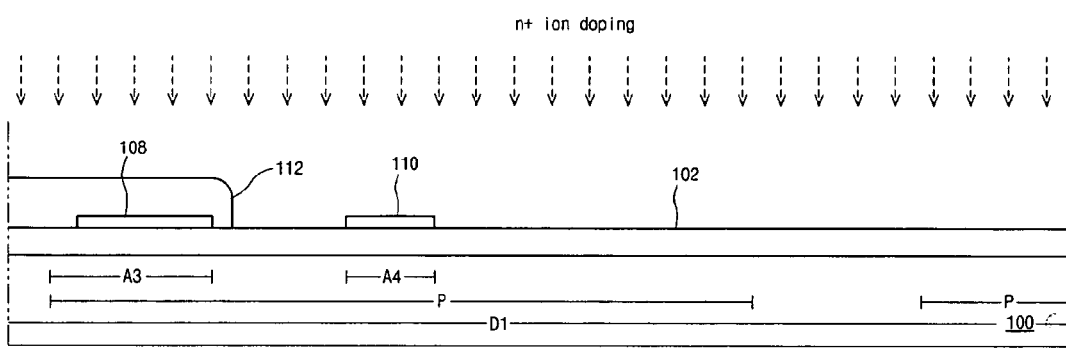

In FIGS. 7B and 8B, a first photoresist pattern 112 that covers the first to third semiconductor layers 104, 106 and 108, except the first storage electrode 110, is formed through a second mask process. The first storage electrode 110 that is exposed from the first photoresist pattern 112 is doped with high concentration n-type (n+) impurities.

The first photoresist pattern 112 is removed from the substrate 100 after the doping step.

Figure 7C:
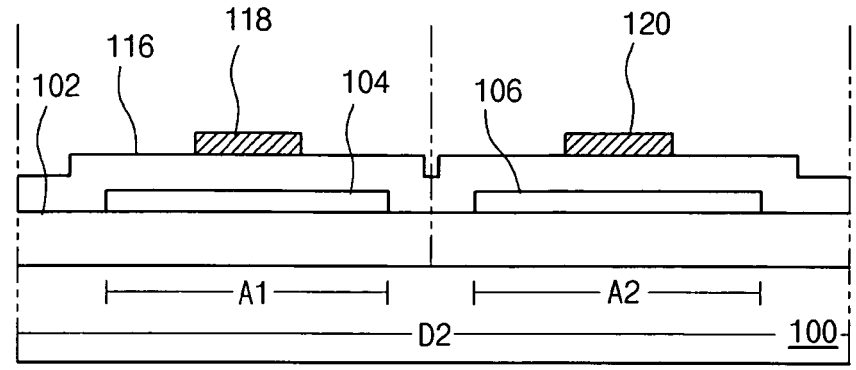
Figure 8C:
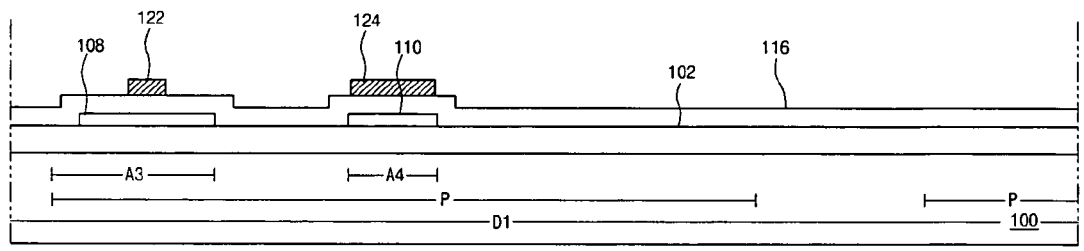

As shown in FIGS. 7C and 8C, a gate insulating layer 116 and a first conductive metallic material is sequentially deposited, the first conductive metallic material, and patterned into first to third gate electrodes 118, 120 and 122 and a second storage electrode 124 through a third mask process. The first to third gate electrodes 118, 120 and 122 are disposed on central portions of the first to third semiconductor layers 104, 106 and 108. The second storage electrode 124 is disposed over the first storage electrode 110. Although not shown, a gate line is connected to the third gate electrode 122. For example, the gate insulating layer 116 includes at least one of an inorganic insulating material group consisting of silicon nitride (SiNx) and silicon oxide (SiOx).

Figure 7D:
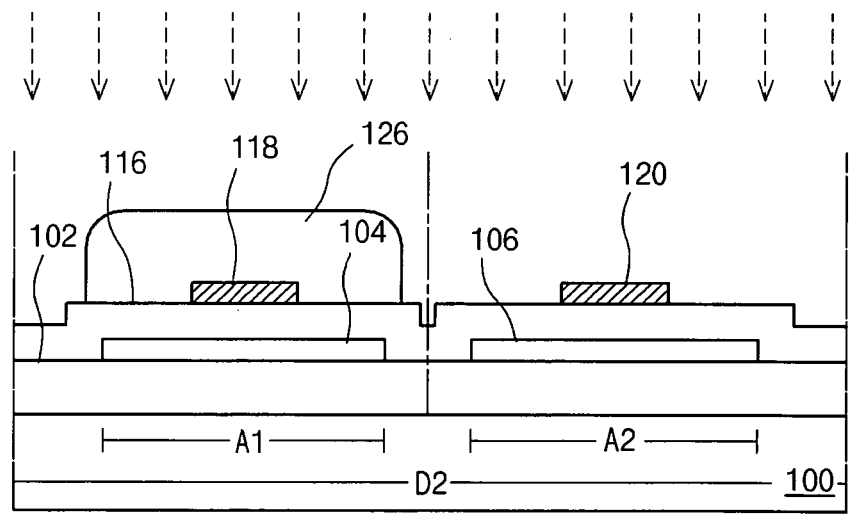
Figure 8D:
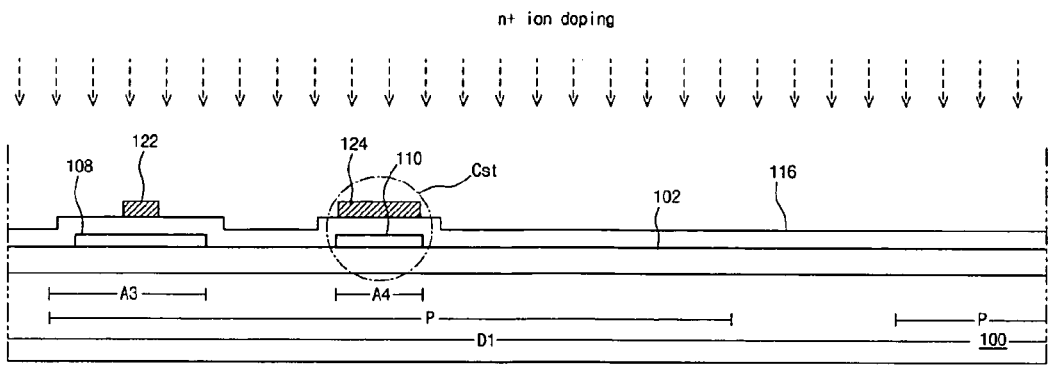

As shown in FIGS. 7D and 8D, a second PR pattern 126 that covers the first gate electrode 118 is formed through a fourth mask process. The second PR pattern 126 corresponds to the first semiconductor layer 104. The second and third semiconductor layers 106 and 108 are doped with high concentration n-type (n+) impurities.

A portion between the second and the third semiconductor layers has an ohmic-contact property.

Since the first storage electrode 110 of poly silicon material is doped with the same n (+) impurities through the previous second mask, an additional PR pattern that shields the fourth region A4 includes the first and the second storage electrodes 110 and 124 and may be unnecessary.

The second PR pattern 126 is removed from the substrate 100 after the doping process.

Figure 7E:
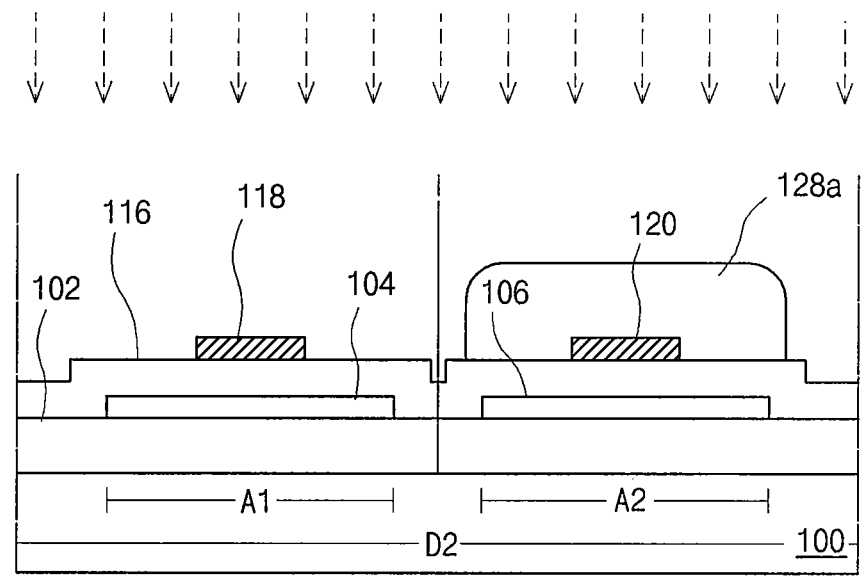
Figure 8E:
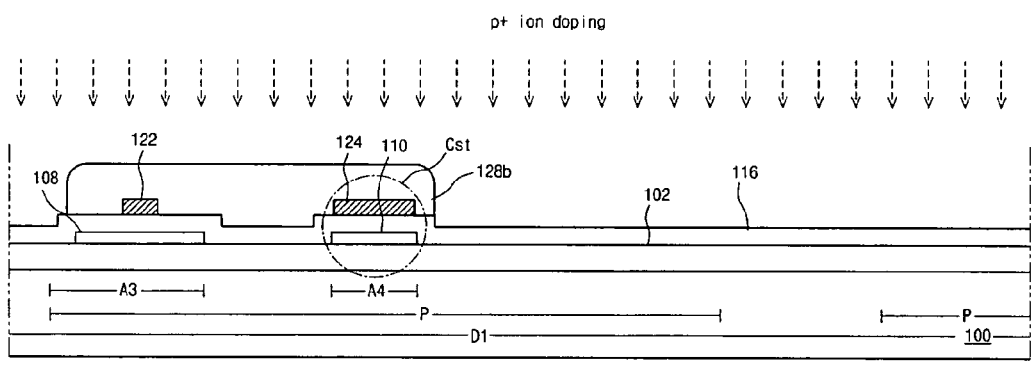

As shown in FIGS. 7E and 8E, a third PR pattern 128a that covers the second gate electrode 120 and a fourth PR pattern 128b that covers the third gate electrode 122 and the second storage electrode 124 are formed through a fifth mask process. The third PR pattern 128a corresponds to the second semiconductor layer 106, and the fourth PR pattern 128b corresponds to the third semiconductor layer 108, the first storage electrode 110, and a portion between the third semiconductor layer 108 and the first storage electrode 110. The first semiconductor layer 104 that is exposed from the second and the third PR patterns 128a and 128b is doped with high concentration p-type (p+) impurities through a fifth mask process.

The doped portions of the first semiconductor layer 104 have an ohmic-contact property. The third and the fourth PR patterns 128a and 128b are removed from the substrate 100 after the doping process.

Figure 7F:
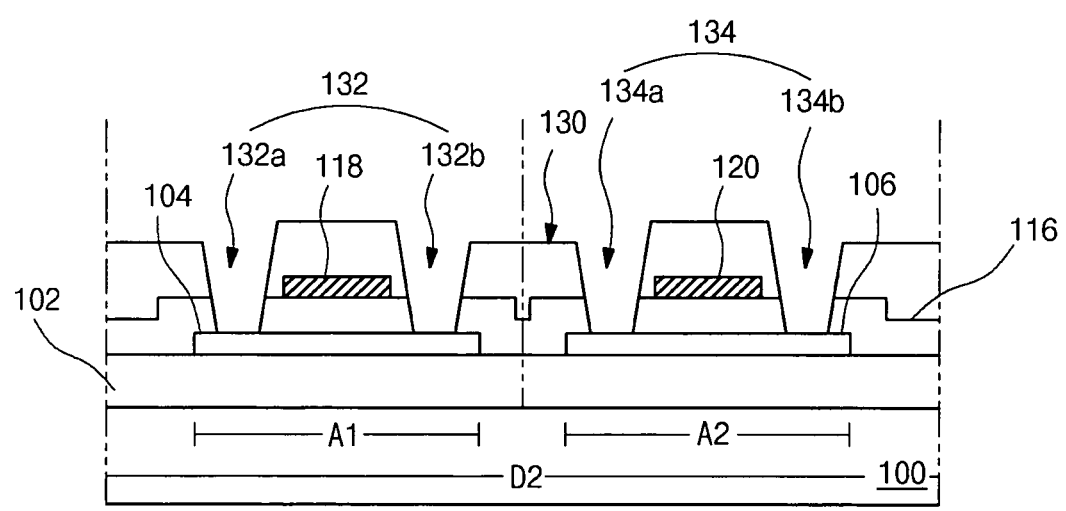
Figure 8F:
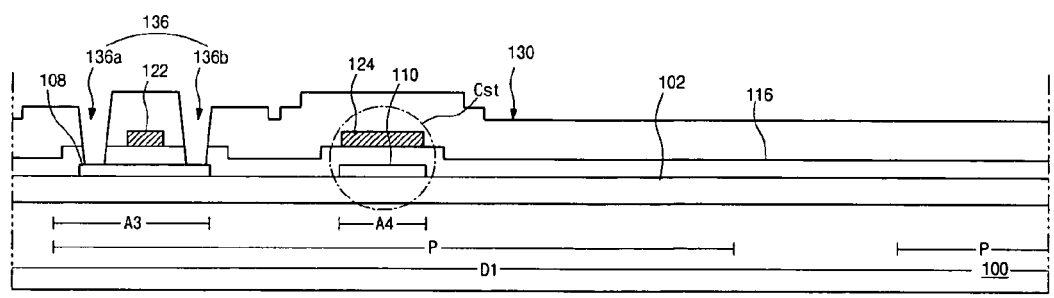

As shown in FIGS. 7F and 8F, an interlayer insulating layer 130 is formed over the substrate 100. The gate insulating layer 116 and the interlayer insulating layer 130 are patterned into first to third contact holes 132, 134 and 136 that expose ohmic contact regions (not shown) of the first to third semiconductor layers 104, 106 and 108, respectively, through a sixth mask process. For example, the interlayer insulating layer 130 includes an inorganic insulating material such as silicon nitride (SiNx) or silicon oxide (SiOx).

The first to third contact holes 132, 134 and 136 includes first source and first drain contact holes 132a and 132b, second source and second drain contact holes 134a and 134b, and third source and third drain contact holes 136a and 136b.

Figure 7G:
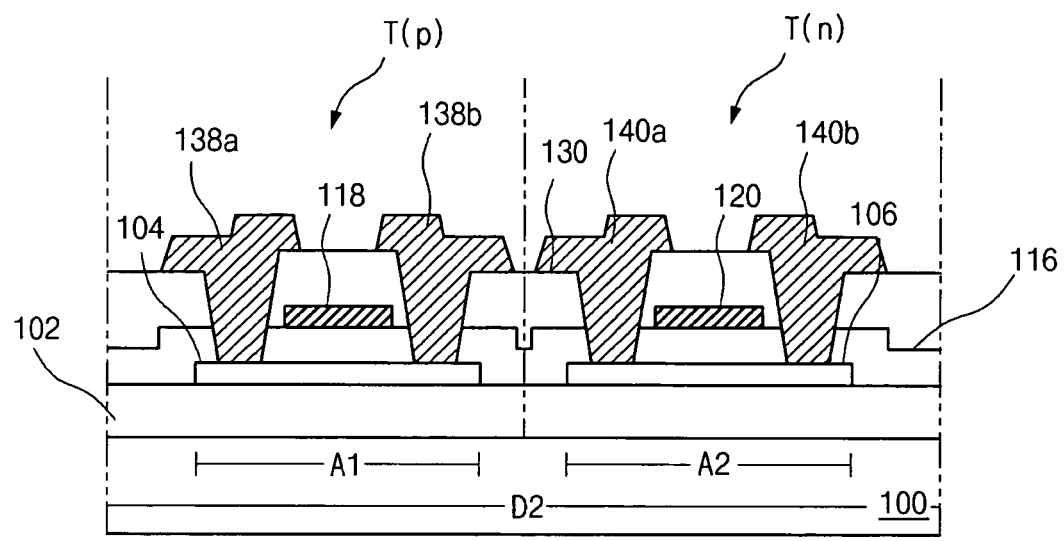
Figure 8G:
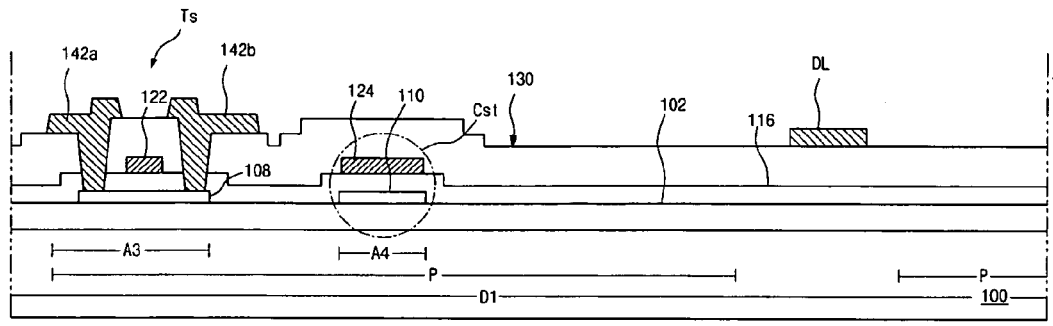

As shown in FIGS. 7G and 8G, first source and first drain electrodes 138a and 138b, second source and second drain electrodes 140a and 140b, third source and third drain electrodes 142a and 142b, and a data line DL are formed by depositing and patterning a second conductive metallic material through a seventh mask process using, for example, aluminum neodymium (AlNd). For example, the second conductive metallic material may be selected from the group consisting of chromium (Cr), molybdenum (Mo), tungsten (W), copper (Cu) and aluminum alloy.

The data line DL is substantially connected to the third source electrode 142a and crosses the gate line GL (of FIG. 5) to define the pixel region P. The first source and the first drain electrodes 138a and 138b are connected to the ohmic contact regions of the first semiconductor layer 104 via the first source and the first drain contact holes 132a and 132b, the second source and the second drain electrodes 140a and 140b are connected to the ohmic contact regions of the second semiconductor layer 106 via the second source and the second drain contact holes 134a and 134b, and the third source and the third drain electrodes 142a and 142b are connected to the ohmic contact regions of the third semiconductor layer 108 via the third source and the third drain contact holes 136a and 136b.

The first semiconductor layer 104, the first gate electrode 118, the first source electrode 138a and the first drain electrode 138b constitute a p-type thin film transistor T(p), the second semiconductor layer 106, the second gate electrode 120, the second source electrode 140a and the second drain electrode 140b constitute an n-type thin film transistor T(n). The p-type thin film transistor T(p) and the n-type thin film transistor T(n) constitute a CMOS element.

The third gate electrode 108, the third source electrode 142a and the third drain electrode 142b constitute a switching thin film transistor Ts. For example, the switching thin film transistor Ts consists of an n-type thin film transistor as shown in FIG. 8G. The first and the second storage electrodes 110 and 124 with the gate insulating layer 116 therebetween constitute a storage capacitor Cst.

Figure 7H:
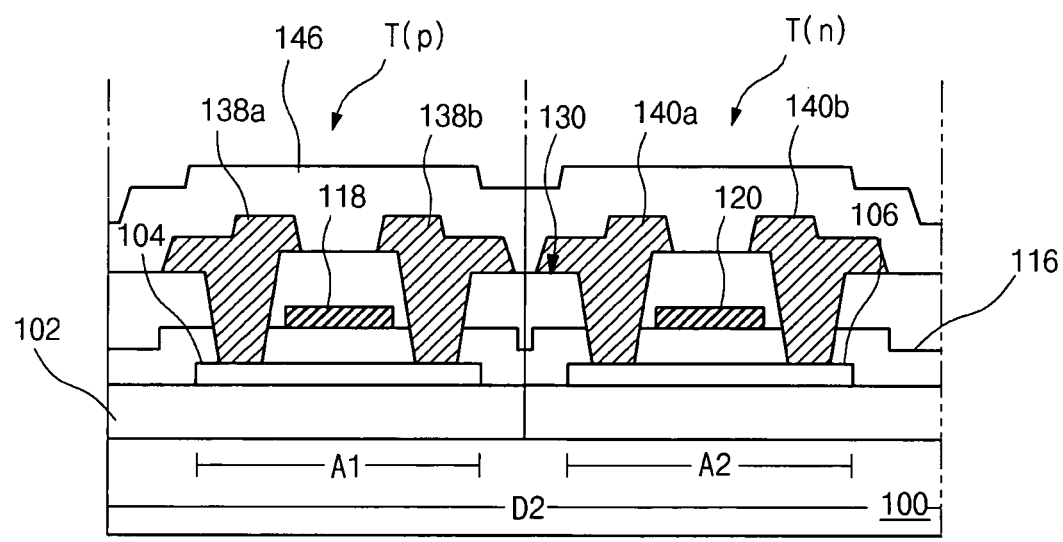
Figure 8H:
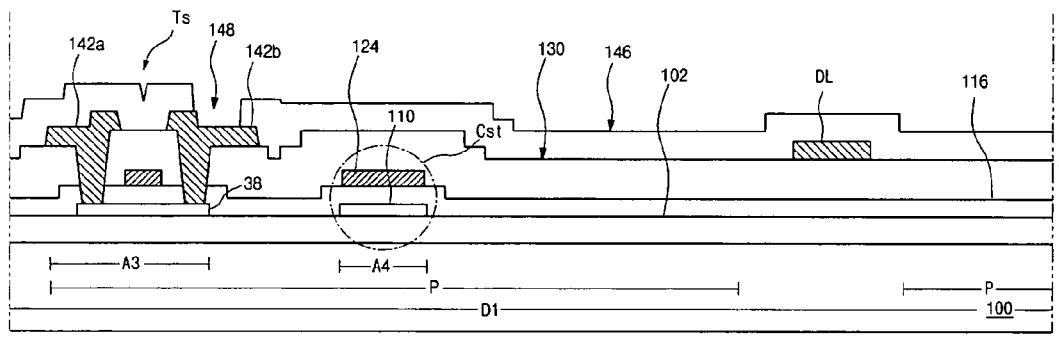

As shown in FIGS. 7H and 8H, a passivation layer 146 is formed over the substrate 100 and is patterned to have a drain contact hole 148 that exposes a portion of the third drain electrode 142b through an eighth mask process.

Figure 7I:
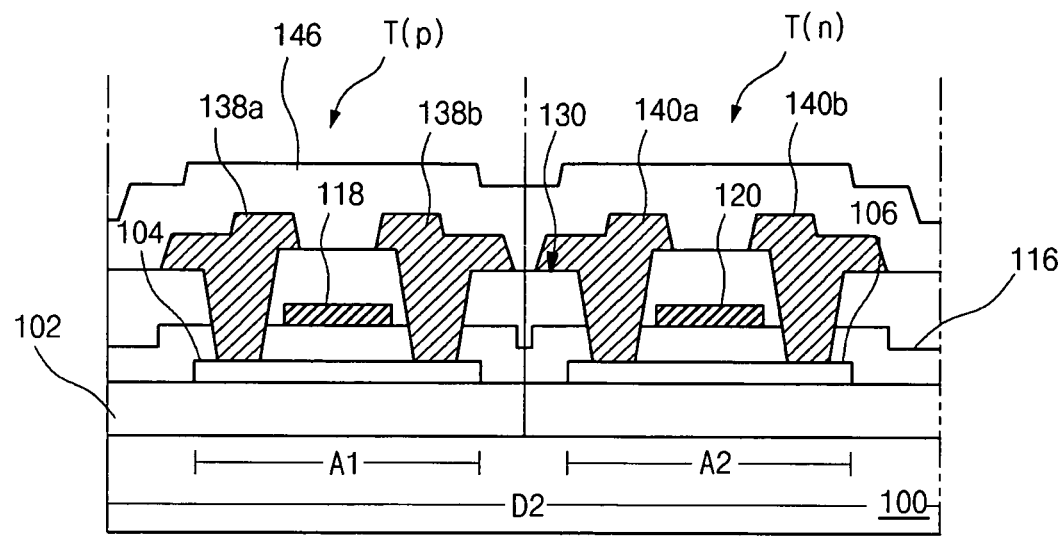
Figure 8I:
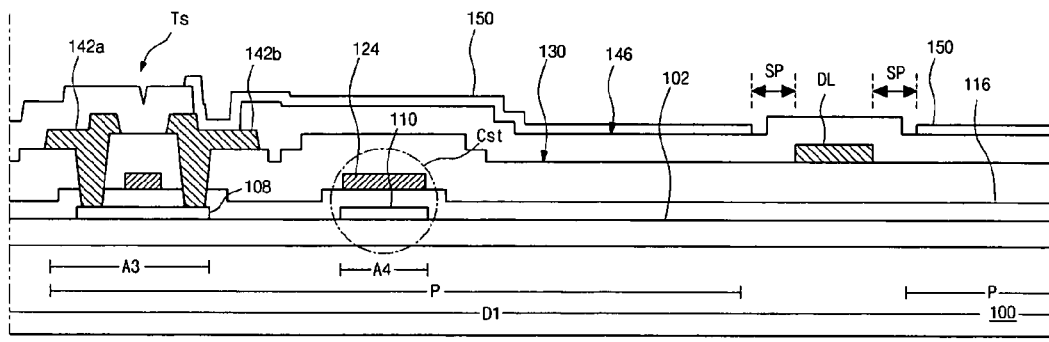

As shown in FIGS. 7I and 8I, a pixel electrode 150 is formed by depositing and patterning a transparent conductive material such as indium tin oxide (ITO) or indium zinc oxide (IZO) through a ninth mask process. The pixel electrode 150 is connected to the third drain electrode 142b via the drain contact hole 148.

The pixel electrode 150 is formed to have spaces SP from the gate and the data lines GL and DL.

Figure 7J:
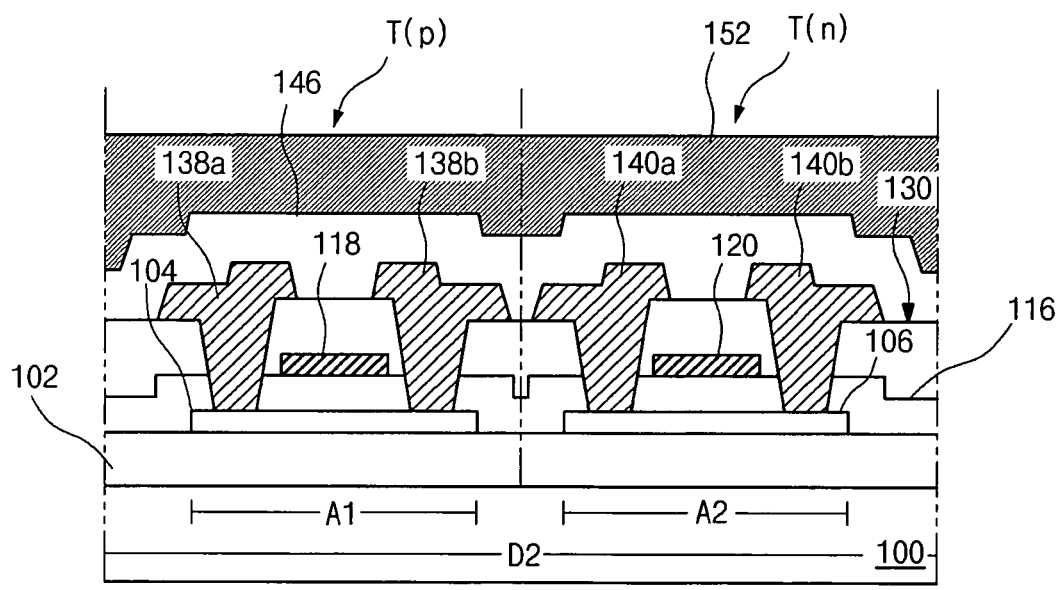
Figure 8J:
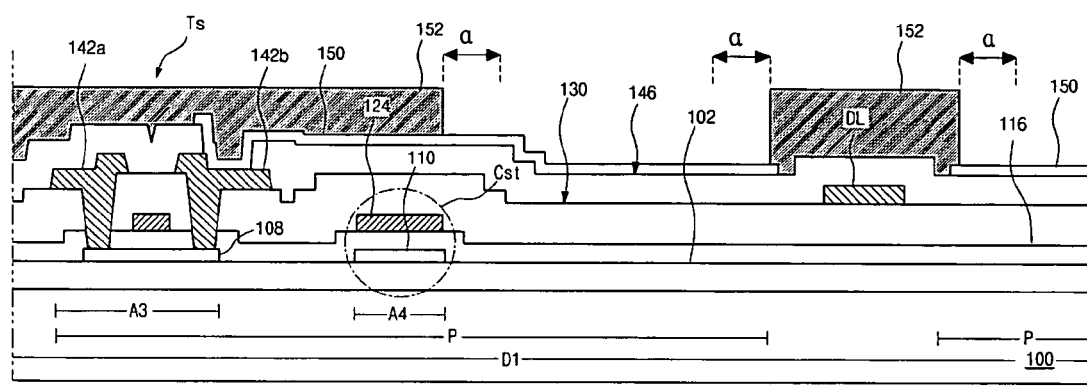

In FIGS. 7J and 8J, a black resin 152 is formed by coating and patterning a black resin over the substrate 100 in the non-display area D2 and a non-pixel region of the display area D1 through a tenth mask process. The non-pixel region corresponds to the gate line GL, the data line DL, the switching thin film transistor Ts, the storage capacitor Cst, and the spaces SP between the gate line GL and the pixel electrode 150 and between the data line DL and the pixel electrode 150.

The align margin α that considers a misalignment can be omitted because the black matrix 152 is directly formed on an array substrate that includes the gate line GL, the data line DL.

An aperture region may be increased more than at least 4 micrometers (μm) in comparison with that of the related art.

According to the LCD device and the method of fabricating the same, since the black matrix as a light shielding means is directly formed on the array substrate instead of the color filter substrate of the opposite substrate to the array substrate, the align margin can be omitted. Therefore, the aperture region that corresponds to the omitted align margin can be obtained, thereby providing the LCD having a high brightness.

It will be apparent to those skilled in the art that various modifications and variations can be made in the present embodiments without departing from the spirit or scope of the embodiments. It is intended that the present invention cover the modifications and variations of the embodiments provided they come within the scope of the appended claims and their equivalents.

What is claimed is:

1. An array substrate for a liquid crystal display device including a plurality of pixel regions, comprising:
   a p-type driving TFT, an n-type driving TFT and a switching TFT on a substrate that includes a display area and a non-display area, wherein the p-type and the n-type driving TFTs are in the non-display area and the switching TFT is in the display area;
   a gate insulating layer on the substrate that includes first, second and third semiconductor layers;
   first, second and third gate electrodes and a gate line connected to the third gate electrode on the gate insulating layer, wherein the first, second and third gate electrodes correspond to central portions of the first, second and third semiconductor layers;
   a first storage electrode in the display area and a second storage electrode over the first storage electrode, wherein the first and second storage electrodes form a storage capacitor with the gate insulating layer therebetween;
   an interlayer insulating layer on the substrate that includes the first, second and third gate electrodes, wherein the interlayer insulating layer has first, second and third contact holes that expose ohmic contact regions of the first, second and third semiconductor layers;

first, second and third source electrodes and first, second and third drain electrodes and a data line on the interlayer insulating layer, wherein the data line is connected to the third source electrode and crosses the gate line to define a pixel region, wherein each of the first, second and third source electrodes and the first, second and third drain electrodes contacts each of the ohmic contact regions of the first, second and third semiconductor layers via each of the first to third contact holes;

a passivation layer on the substrate that includes the first, second and third source electrodes and the first, second and third drain electrodes and the data line, wherein the passivation layer has a drain contact hole that exposes a portion of the third drain electrode;

a pixel electrode on the passivation layer, wherein the pixel electrode connects to the third drain electrode via the drain contact hole; and a black matrix on the substrate that includes the pixel electrode, the pixel electrode having an overlapping portion that overlaps with the black matrix and a non-overlapping portion exposed from the black matrix and connected to the overlapping portion, wherein the overlapping portion of the pixel electrode is in direct contact with the black matrix and connected to the third drain electrode under the black matrix, the storage capacitor being disposed between the non-overlapping portion of the pixel electrode and the third drain electrode in a same pixel region, wherein the black matrix is in the non-display area and a non-pixel area of the display area, wherein the black matrix is formed on upper surfaces of the passivation layer and the pixel electrode, wherein the black matrix directly contacts a portion of the passivation layer between the pixel electrode and the data line and directly contacts an end portion of the pixel electrode, and wherein the black matrix completely covers the storage capacitor and the data line.

2. The array substrate according to claim 1, wherein the non-pixel region includes regions that correspond to the gate line, the data line, a space between the pixel electrode and the data line, and the switching TFT.

3. The array substrate according to claim 1 coupled to a color filter substrate, wherein the color filter substrate includes a color filter layer on another substrate and a common electrode on the color filter layer.

4. The array substrate according to claim 3, wherein the color filter layer includes red, green and blue sub-color filter layers, each of the red, green and blue sub-color filter layers in the pixel region, wherein the black matrix corresponds to boundaries between the red, green and blue sub-color filter layers.

5. The array substrate according to claim 1, wherein the black matrix covers a portion between the gate line and the second storage electrode.

* * * * *